Dec. 16, 1969 W. J. KABRICK 3,484,709

SOLID STATE AUDIO DRIVER CIRCUIT

Filed June 13, 1966 2 Sheets-Sheet 1

INVENTOR.

Wallace J. Kabrick

BY Hill, Sherman, Meroni, Gross & Simpson ATTORNEYS

SOLID STATE AUDIO DRIVER CIRCUIT

Filed June 13, 1966 2 Sheets-Sheet 2

INVENTOR.
Wallace J. Kabrick

BY Hill, Sherman, Meroni, Gross & Simpson ATTORNEYS

United States Patent Office 3,484,709

Patented Dec. 16, 1969

3,484,709

SOLID STATE AUDIO DRIVER CIRCUIT

Wallace J. Kabrick, Plainville, Ill., assignor to Gates Radio Company, Quincy, Ill., a corporation of Illinois Filed June 13, 1966, Ser. No. 556,933
Int. Cl. H03f 3/26
U.S. Cl. 330—15 21 Claims

ABSTRACT OF THE DISCLOSURE

A solid stage audio driver circuit for a push-pull amplifier having substantially non-linear grid impedances including first and second compound amplifier stages each having first and second strings of series connected transistors. The first stage is connected to have a substantial voltage gain and the second stage is connected to have a substantial current gain. Means are provided to couple the output of the second compound amplifier stage to the respective grids of the push-pull amplifier. A controller transistor is coupled to the input of the first compound amplifier stage, and a pre-distorted information signal is fed back from the output of the push-pull amplifier to the controller transistor for improving the linearity of the driver. A high resistance is coupled between the base circuits of the transistors in the first string of the first compound amplifier, and the output voltage of the first compound amplifier is applied substantially equally across the base-to-base resistances thereof.

This invention relates to a solid state amplifier device and in particular relates to a solid state audio driver circuit for applying an amplified audio signal to the control grid of a power amplifier tube.

In radio frequency transmitters, means must be provided for substantially increasing the power of the input audio signal in order to effectively modulate a high-frequency, high-power carrier signal. To accomplish this objective, it is common to operate power tubes as Class B power amplifiers, for instance, and to connect the tubes in a push-pull arrangement. The push-pull arrangement eliminates even order harmonics which would otherwise be present as distortion in the output signal and increases the overall power performance of the amplifier.

However, it has been found that the grid impedance of Class B triode modulator tubes, for instance, is extremely non-linear, ranging from almost infinity throughout most of the signal cycle to a very low impedance when driven positive during the positive peak of the signal cycle. Due to the fact that amplifier tubes which have a relatively high output impedance have been characteristically used to apply the audio signal to the grids of the amplifier modulator tubes, the non-linearity of the grid impedances inevitably results in undesirable distortion at the output of the push-pull amplifier.

To eliminate the distortion resulting from the unfavorable combination of a tube operated amplifier device having a high output impedance applied to the non-linear impedance of the control grids of the push-pull modulator amplifier, a driver transformer has generally been employed to step down the impedance of the grid circuit. However, in accomplishing the proper impedance relationship, the transformer adds approximately 30–40% to the total cost of the amplifier and modulator networks.

In addition to the need for a relatively costly transformer to reduce the effect of the non-linear grid impedance of high power modulator tubes, the use of audio amplifier tubes for applying the audio signal to the grid of the modulator tubes requires an additional power supply, one to provide a bias for the audio amplifier tubes and a separate bias for the grids of the modulator tubes.

For instance, amplifier tubes may require a +450 volt supply while the grid of the modulator tubes may require a bias of approximately −240 volts. The need for a separate bias in the audio amplifier circuit increases the power consumption of the entire network. For instance, in an audio amplifier circuit for a 5 kw. transmitter, the separate bias supply for the audio amplifier tubes may consume approximately 50 watts. It is apparent that it would be desirable to reduce the power consumption of the audio driver circuit.

In addition, the operation of the tube-driven audio amplifier circuit for a typical 5 kw. transmitter may require in the order of 200 watts. If this power consumption could be reduced, the overall cost and size of the amplifier network could, accordingly, be reduced. Also, the problem of providing adequate heat transfer from the amplifier unit could be significantly reduced.

Accordingly, it is a principal object of this invention to provide an audio driver circuit which may be directly coupled to the grid of a power modulator tube and which eliminates the distortion otherwise inherent in the non-linear grid impedance of the modulator tube.

It is also an object of this invention to provide an audio amplifier circuit which operates at approximately the same potential as the bias requirements of the grid circuit in an associated power modulator tube.

It is another object of this invention to provide a solid state audio driver circuit which consumes a minimum of power and which is appreciably less costly then present tube operated driver circuits.

It is a further object of this invention to provide a solid state amplifier circuit for developing an amplified signal which greatly exceeds the power and voltage ratings of any one available solid state amplifier device.

It is another object of this invention to provide an amplifier device having first and second strings of series connected transistors wherein the output of each transistor of said first string is applied at the input of one transistor of said second string and wherein a high base-to-base resistance is connected between the base circuits of transistors within said first string.

It is a further object of this invention to provide an amplifier device having a string of series connected transistors and having a controller transistor connected such that the output of the controller transistor is applied substantially equally at the individual inputs of the series connected transistors.

It is an additional object of this invention to provide an audio driver circuit having a solid state amplifier network connected in an emitter follower configuration for applying an amplified audio signal to the grid of a high power modulator tube.

It is also an object of this invention to provide a two-stage solid state amplifier device wherein the first stage comprises a common-emitter transistor string for increasing the voltage of an applied input signal and wherein the second amplifier stage comprises a common-collector transistor string for increasing the current associated with the output of the first amplifier stage.

It is another object of this invention to provide a push-pull audio driver circuit utilizing solid state components for negating the distortion effect of the non-linear grid impedance of push-pull modulator tubes and for being operated at a voltage level which is substantially equivalent to the bias level required at the grid circuit of the modulator tubes.

These and other objects, features and advantages of the present invention will be understood from the following description and the associated drawings wherein reference numerals are utilized in designating an illustrative embodiment.

Figure 1:
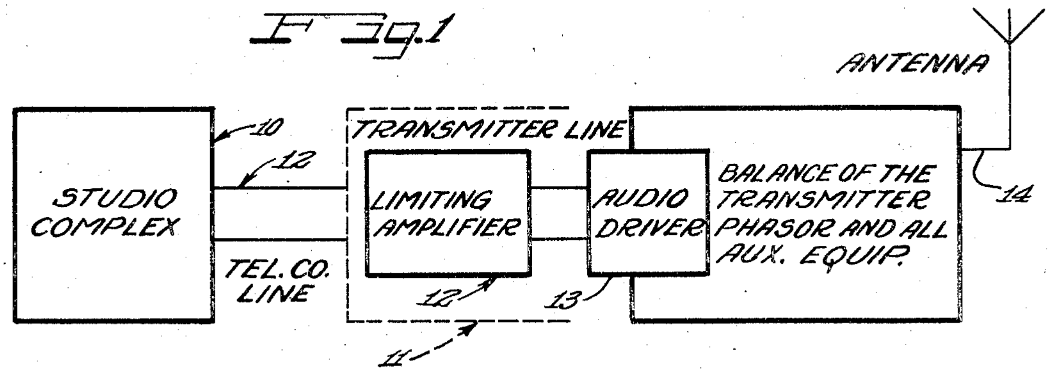
FIGURE 1 is a block diagram showing the relationship of an audio driver circuit according to this invention with a standard AM broadcasting station.

FIGURE 1 illustrates a working environment for the features of this invention and comprises generally a studio complex 10 for converting acoustical or sound energy into an electrical signal which may be later processed and transmitted. The information signal developed at the studio complex 10 may be relayed to a transmitter 11 through telephone company lines 12 or the like.

At the transmitter 11 a limiting amplifier 12 is provided to assure a given maximum signal level which will subsequently be applied to the power amplification stages of the transmitter. The output of the limiting amplifier 12 is connected directly to an audio driver circuit having the features of this invention for controlling a push-pull modulation amplifier; the output of the modulation amplifier is applied to the power amplifier to produce a modulated carrier signal which is then delivered to the balance of the transmitter, phasor, and auxiliary equipment for eventual broadcasting at an antenna 14.

Figure 2:
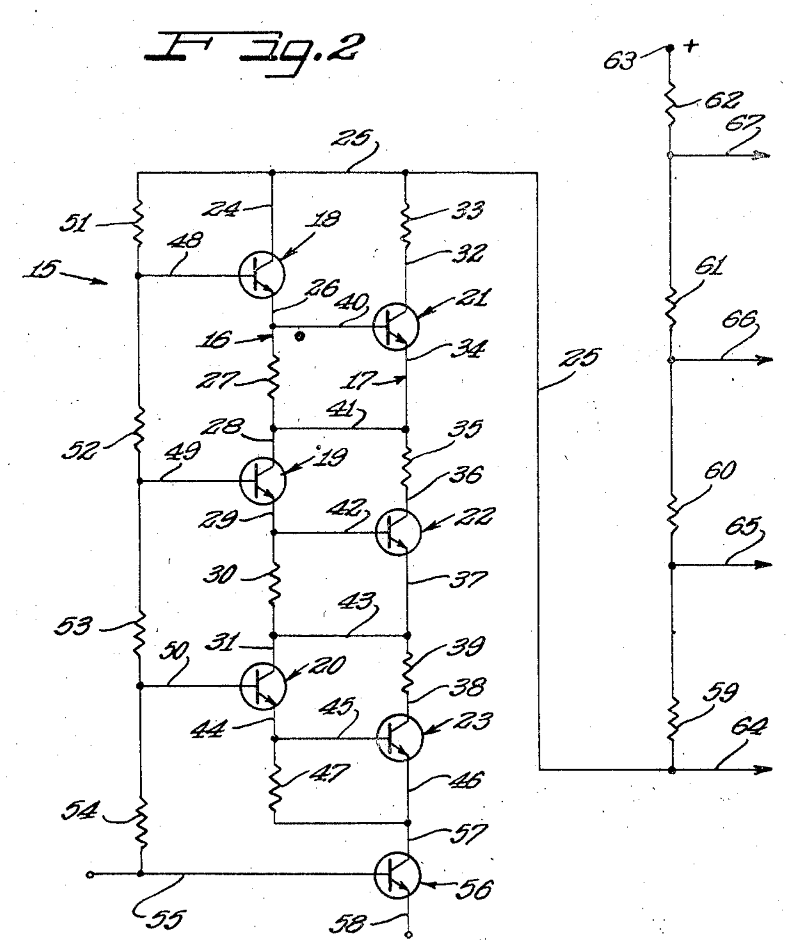
FIGURE 2 is a schematic diagram of an amplifier device according to this invention.

One of the amplifier circuits associated with the audio driver network of this invention is shown apart from its working environment in FIGURE 2. The amplifier device 15 is a voltage amplifier stage and comprises generally first and second strings 16 and 17 of series connected transistors. The first string 16 has three transistors 18, 19 and 20, and the second string 17 also has three transistors 21, 22 and 23.

The transistor 18 of the first string 16 has a collector 24 connected to a voltage supply line 25 and an emitter 26 connected through a resistor 27 to the collector 28 of the transistor 19. Similarly, the transistor 19 has an emitter 29 connected through a resistor 30 to the collector 31 of the transistor 20. Hence, the transistors 18, 19 and 20 are said to be series connected.

The transistors 21, 22 and 23 of the second series string 17 are connected in a similar manner. In particular, the transistor 21 has a collector 32 connected through a resistor 33 to the supply line 25. Also, the transistor 21 has an emitter 34 connected through a resistor 35 to a collector 36 of the transistor 22. In a like manner, the emitter 37 of the transistor 22 is connected to the collector 38 of the transistor 23 through the resistor 39. Hence, the transistors 21, 22 and 23 are also said to be series connected.

The first and the second strings 16 and 17 are compounded in the following manner: The collector 32 of the transistor 21 is connected through the resistor 33 and the supply line 25 to the collector 24 of the transistor 18. Also, the base 40 of the transistor 21 is connected directly to the emitter 26 of the transistor 18. In addition, the emitter 34 of the transistor 21 is connected directly through a line 41 to the collector 28 of the transistor 19. Similarly, the transistor 22 has a base 42 connected directly to the emitter 29 of the transistor 19 and has an emitter 37 connected directly through a line 43 to the collector 31 of the transistor 20. The formation of the first and second transistor strings 16 and 17, respectively, is completed by connecting the emitter 44 of the transistor 20 to the base 45 of the transistor 23 and by connecting the emitter 46 of the transistor 23 through a resistor 47 to both the base 45 and the emitter 44.

The three transistors 18, 19 and 20 of the first series transistor string 16 have base connections 48, 49 and 50, respectively. Associated with the base connections 48, 49 and 50 are four resistors 51, 52, 53 and 54. The resistor 51 is connected between the base 48 and the collector 24 of the transistor 18. The resistors 52 and 53 are connected, respectively, between the base 48 and the base 49 of the transistors 18 and 19 and between the base 49 and the base 50 of the transistors 19 and 20.

The resistor 54 is connected between the base 50 and a base 55 of a controller-transistor 56. The controller-transistor 56 has a collector 57 connected to the emitter 46 of the transistor 23 and through the resistor 47 to the emitter 44 of the transistor 20. The controller-transistor 56 also has an emitter connection 58 which together with the base connection 55 comprises the input terminals of the compounded series amplifier 15.

Output load resistors 59, 60, 61 and 62 are connected in series through the supply line 25 and the resistor 33 to the collector 32 of the transistor 21. A power supply may be applied to the load resistors as at the point 63. The output signal appearing across the resistors 59 through 62 may be applied to subsequent current amplification stages through connections 64, 65, 66 and 67.

When an information signal such as an audio signal is applied across the input terminals 55 and 58 of the controller-transistor 56, a change in current within the transistor 56 generates a change in current and voltage in the load resistor 59 through 62. However, the change in voltage across the resistors 59 through 62 is impressed across the resistors 51 through 54 through the supply line 25. The voltages across the resistors 51, 52 and 53 then produce a change in current in the transistors 18, 19 and 20. The change in current in the transistors 18, 19 and 20 is then applied to the input of the transistors 21, 22 and 23 which, in turn, results in division of the signal and supply voltage across transistors 21, 22, 23 and 56 proportional to the division across resistors 51, 52, 53 and 54. Hence, the amplifier network 15 is a solid state system which uses a controller-transistor 56 for initiating a voltage change in the load resistances 59 through 62, which voltage change is then applied equally across the input resistances of the first amplifier string 16. The output of the first transistor string is applied to the input of the second transistor string, and the final amplified voltage signal is generated across the output load resistances 59 through 62.

To accomplish approximately equal sharing of the amplified signal, the base-to-base resistors 51 through 54 are provided to have a substantially high resistance. Accordingly, the base current of the transistors 18, 19 and 20 will be small and the voltage differential attributed to the base currents within the resistors 51, 52 and 53 will be slight. For instance, all three base currents flow through the resistor 51, only two base currents flow through the resistor 52, and only one base current flows through the resistor 53. However, by limiting the value of the base currents, the voltage differentials in the resistors 51, 52 and 53 can be minimized, and the series transistors can be made to share approximately equally the amplification of the voltage signal. It may be noted that the transistors 18, 19 and 20 may be said to be connected in a common-collector configuration, as the input signal is applied between the base and collector connections of those transistors with the output at the emitter connection, and the transistors 21, 22 and 23 may be said to be in a common-emitter configuration as the input voltage is applied across the base and emitter connections with the output at the collector connection.

Figure 3:
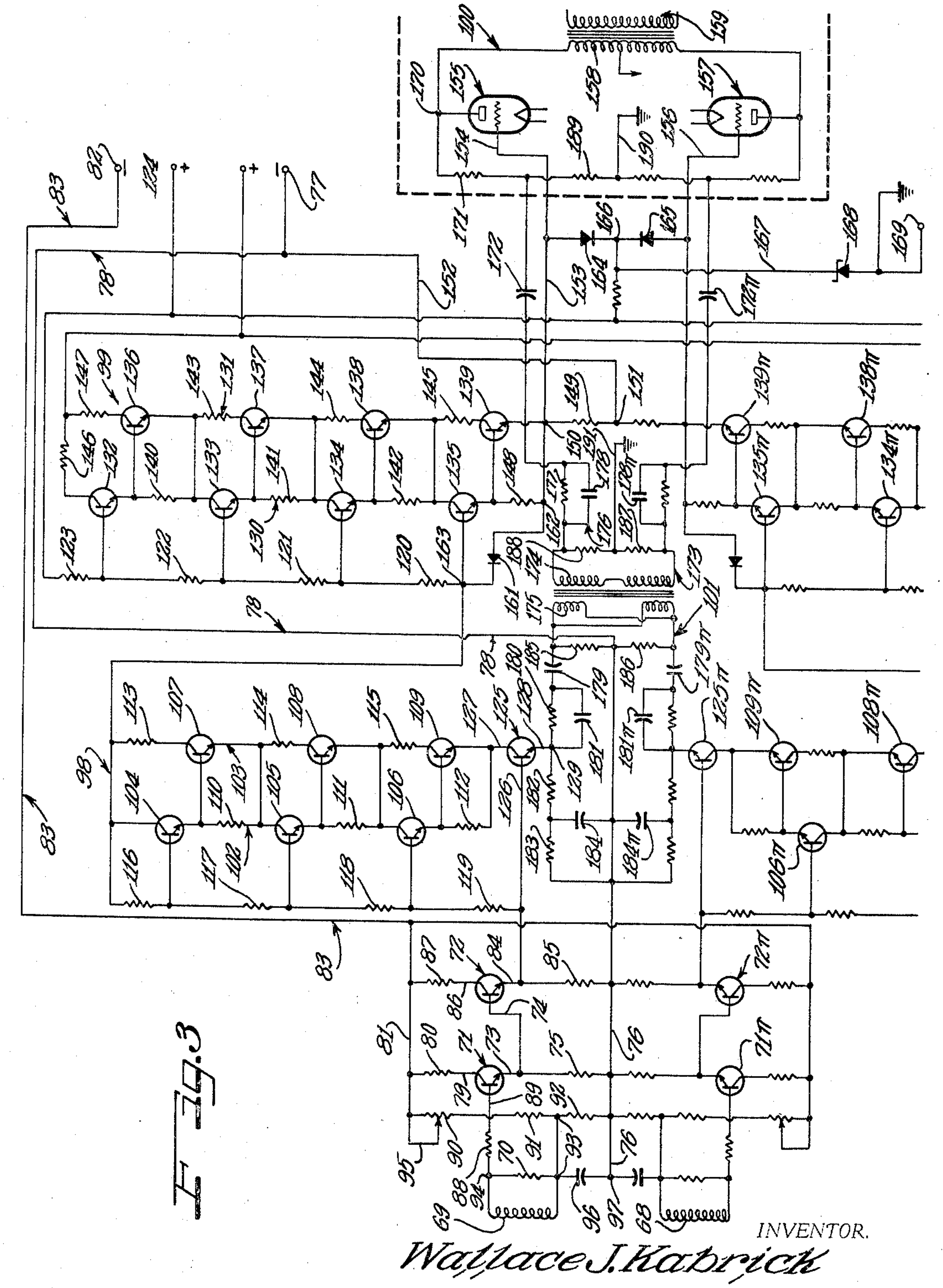
FIGURE 3 is schematic diagram of an audio driver circuit for performing the function indicated in FIGURE 1 and for utilizing features of the amplifier device of FIGURE 2.

Referring to FIGURE 3, the audio or information signal of the driver circuit may be applied to an input circuit such as a filter network and applied to a transformer. The transformer may have secondary windings such as windings 68 and 69 for dividing the audio signal into positive-going and negative-going components. This means that the signal at the secondary winding 69 will be 180° out of phase with the signal at the winding 68, which is the necessary requirement for the input signal of a push-pull amplifier. The driver circuit of FIGURE 3, accordingly, is symmetrical in function for processing the signals received at the windings 68 and 69. Therefore, discussion of the driver circuit will be limited to the components for processing the signal applied at the secondary winding 69 which may be characterized as the positive-going signal.

The secondary winding 69 is terminated in a resistor 70 which is used to present a constant reflected load to the transformer primary. Two transistors 71 and 72 are connected as a compounded emitter-follower configuration for reducing the high impedance of the input transformer. The transistor 71 has an emitter 73 connected directly to the base 74 of the transistor 72 and connected through a resistor 75 to a center or reference line 76. The reference line 76 has a negative biasing power supply applied thereto which is received from an input terminal 77 through a feed line 78. The transistor 71 similarly has a collector 79 connected through a resistor 80 to a voltage supply line 81. The voltage supply line 81 is energized from an input terminal 82 through a feed line 83. The transistor 72 also has an emitter 84 which is connected through a resistor 85 to the voltage supply line 76. In addition, the collector 86 of the transistor 72 is connected through a resistor 87 to the voltage supply line 81. Hence, the transistors 71 and 72 are said to be connected in a compounded relationship.

The compounded configuration of the transistors 71 and 72 is connected to the transformer winding 69 through a resistor 88 which is used to isolate the winding 69 with its inductive reactance from the base 89 of the transistor 71 with its capacitive reactance in order to prevent instability or oscillations. Forward bias for the transistor 71 is accomplished through the use of three resistors 90, 91 and 92. The resistors 90 and 91 are connected in series from the supply line 81 to a first terminal 93 of the winding 69. The second terminal 94 of the winding 69 is connected through the isolation resistor 88 to the base 89 of the transistor 71. The resistor 92 is connected from the first terminal 93 of the winding 69 to the voltage supply line 76. Also, the resistor 90 is variable, having an adjustable arm 95 for altering the value of the biasing signal applied between the base 89 and the collector 79 of the transistor 71. Finally, a capacitor 96 is connected between the terminal 93 and a junction point 97 for by-passing the AC signal of the winding 69 to the common supply line 76.

In operation, an audio signal received at the secondary winding 69 is applied between the base 89 and the collector 79 of the transistor 71. The output of the transistor 71 at the emitter 73 is applied to the input of the transistor 72 at the base 74. The output of the transistor 72 is then available at the emitter 84 for being applied to subsequent amplifier stages. The transistors 71 and 72 are connected in a compounded emitter-follower configuration with the result that the output impedance of the transistor 72 has been reduced to approximately 60 ohms as compared with approximately 60K ohms of the referenced half secondary 69 of the input transformer.

The audio signal available at the emitter 84 of the transistor 72 is then processed through a voltage amplification stage 98 and a current amplification stage 99. The output of the current amplification stage 99 is then applied to the grids of a push-pull modulator stage 100. Finally, a feedback network 101 is used for predistorting the information signal for the purpose of canceling distortion inevitably present at the modulation stage 100.

The voltage amplification stage 98 is essentially similar to the amplification network 15 of FIGURE 2 and comprises first and second transistor strings 102 and 103, respectively. The first transistor string has transistors 104, 105 and 106 series connected, and the second amplification string 103 has transistors 107, 108 and 109 also series connected. The transistor 104 has its emitter connected to the base of the transistor 107 and connection also through a resistor 110 to the collector of the transistor 105. Similarly, the transistor 105 has its emitter connected to the base of the transistor 108 and through a resistor 111 to the collector of the transistor 106. The emitter of the transistor 106 is connected to the base of the transistor 109, and a resistor 112 is connected between the emitters of the transistors 106 and 109.

The collectors of the transistors 104 and 107 are separated by a resistor 113, and further series resistors 114 and 115 are used to separate the emitters and collectors of the series connected transistors 107, 108 and 109. Also, the emitters of the transistors 107 and 108 are connected directly to the collectors of the transistors 105 and 106, respectively.

The resistors 110, 111 and 112 may be in the order of 200 ohms for satisfying the emitter-to-base resistance requirements of the transistors 107, 108 and 109, while resistances 116, 117, 118 and 119 may be in the order of 120K ohms for providing a substantially high shunt impedance across the voltage amplifying stage transistor 125 and its associated voltage sharing components.

The output load of the voltage amplifier stage 98 comprises four resistors 120, 121, 122 and 123. The resistor 123 is then connected to a voltage supply source as at the point 124. As in the case of the amplifier network 15 of FIGURE 2, a controller-transistor 125 has a base 126 connected to the resistor 119 and a collector 127 connected to the emitter of the transistor 109. The transistor 125 also has an emitter 128 which is connected to a source of low voltage potential as is available at the circuit junction point 129.

The audio signal is effectively applied between the base 126 and the emitter 128 of the controller-transistor 125, and the resulting change in current through the transistor 125 develops a change in voltage across the resistor string 120 through 123. The change in voltage across the resistor string 120 through 123 is impressed across the resistor string 116 through 119 and is divided substantially equally at the inputs to the transistors 104, 105 and 106. The change in current in the transistors 104, 105 and 106 due to the voltage change impressed at the resistors 116, 117 and 118 is delivered to the inputs of the transistors 107, 108 and 109. The resulting change in current in the transistors 107, 108 and 109 generates a change in voltage across their collector to emitter terminals, each transistor assuming a voltage drop substantially equal to the collector to emitter voltage of transistor 125, which causes a change in voltage in the resistor string 120 through 123 which is then utilized as the input of the current amplification stage 99.

The current amplification stage 99 consists of a third transistor string 130 and a fourth transistor string 131. The transistor string 130 comprises transistors 132, 133, 134 and 135, and the transistor string 131 comprises transistors 136, 137, 138 and 139. Resistors 140, 141 and 142 keep the emitter to base resistance requirements of transistors 136, 137 and 138 below the required value. Resistors 143, 144, 145 and 147 isolate the collector-emitter junctions of the transistors 132, 133, 134 and 135 from the collector base junction of the transistors 136, 137, 138, and 139, respectively. Similarly a resistor 148 isolates the emitter connection of the transistor 135 from the emitter connection of the transistor 139.

The transistors of the first transistor string have base connections to the resistor string 120 through 123 such that the resistors in that string appear between the base connections of adjacent series connected transistors. Hence, the output voltage of the voltage amplification stage 98 is applied substantially equally to the inputs of the transistors 132 through 135 of the transistor string 130.

The transistors of the transistor string 131 have their base connections to the emitter connections of associated transistors of the transistor string 130. In this way, the outputs of the transistors 132 through 135 are connected directly to the inputs of the transistors 136 through 139. It may be noted that the transistors of the transistor string 103 are connected in a common emitter configuration, as the inputs of the transistors in that string are applied between the base and emitter connections with the outputs at the associated collector connections. In contrast, the transistors of the transistor string 131 are connected in a common-collector or emitter-follower configuration wherein the input signals are applied between the base and collector connections with the output signals available at the emitter connections. Accordingly, the transistor string 103 has a high voltage gain, and the transistor string 131 has a high current gain. Accordingly, the voltage gain of the amplifier stage 98 is compounded with the current gain of the amplifier stage 99 for accomplishing a power gain. A resistor 149 has a very high or bridging resistance value so that it will consume very little power and allow the available power to be delivered to the modulator grids. Resistor 149 supplies a grid return from the modulator tube to the negative power supply. When a negative-going signal is applied to transistor strings 130 and 131 to reduce the current through them and consequently raise their collective impedance, resistor 149 causes the modulator tube grid 154 to follow.

The emitter of the transistor 139 is connected to a first terminal 150 of the resistor 149, and the second terminal 151 of the resistor 149 is connected to the common bias level through a voltage supply line 152 which is connected to the circuit junction point 77.

The emitter of the transistor 139 is connected through a feed line 153 to a grid 154 of a modulator tube 155. It is understood that a similar network is connected from the input secondary winding 68 of the input transformer to a grid 156 of a second modulator tube 157.

The modulator tubes 155 and 157 are connected in a push-pull arrangement, as is well understood, through a primary winding 158 of a modulation transformer 159.

It may be noted that the audio driver circuit has been connected directly to the grids 154 and 156 of the push-pull amplifier tubes without the use of an impedance step-up or step-down transformer. This is possible due to the fact that the emitter-follower transistor circuit of this invention has a much lower output impedance than the associated impedance of a tube amplifier network. Accordingly, regardless of the impedance of the grids 154 and 156, the voltage appearing at the grids will be substantially unaffected. This means that without the use of the costly step-down transformer, the audio driver circuit of this invention will provide a high degree of linearity and accordingly a minimum of distortion.

As the audio driver circuit of this invention is vulnerable to being reverse biased and to excessive cut-off voltages, a diode 161 is connected from a junction point 162 to the base junction point 163 associated with the transistor 135. Accordingly, in the event of modulator tube ionization or the like, the transistors 135 and 139 will be maintained in an operative state. Also, any excessive voltages appearing at the grids 154 or 156 of the associated modulator tubes 155 and 157 will be clamped through a pair of diodes 164 and 165 which conduct from the associated grids to a junction point 166 and through a ground line 167 and a Zener diode 168 to ground at the circuit junction point 169. As is well understood, the Zener diode will determine the particular voltage level at which the clamping will occur.

A portion of the plate signal voltage is fed back from the plate 170 of the tube 155 through a resistor 171 and a capacitor 172 to an impedance matching transformer 173. The transformer 173 has, for instance, a 10K ohm to 150 ohm ratio from the primary 174 to the secondary 175 to match into the very low emitter impedance of the transistor 125.

A frequency emphasizing network 176 is connected between the transformer 173 and the capacitor 172 and consists of a resistor 177 and a parallel capacitor 178. This network gives increased frequency response in a selected frequency area to give extra negative feedback.

Similarly, a capacitor 179 and a parallel network consisting of the resistor 180 and a capacitor 181 are provided to give selected frequency response to the feedback signal. Resistors 182 and 183, together with a capacitor 184, couple the emitter 128 of the transistor 125 to the common line 76. The feedback circuit is completed through a resistor 189 to ground as at the point 190.

A positive signal on the base 126 of transistor 125 will result in a 180° phase reversal on its collector load resistor 120–123 which provides a signal of the same phase to the modulator grid 154 of tube 155 which is inverted on the plate 170. The feedback is phased correctly at this point 170 and must not be reversed in its path through transformer 173—thus, it is polarized to deliver a positive going signal to the emitter 128 of transistor 125. Since the feedback signal on the emitter 128 of transistor 125 is the same as the input signal on its base 126, it effectively reduces the base-emitter amplitude of the input signal to transistor 125 with consequent negative feedback.

The distortion products fed back from the plate of the modulator tube 155 are not present in the input signal to the base of transistor 125. Thus, these distortion products are fed to the emitter of transistor 125 in the phase relationship as if they had been fed into the base in a negative going polarity. Thus, they may be considered to be out of phase with the input signal—resulting in partial cancellation of the harmonic products but no cancellation of the original signal at the modulator plate.

It will be understood that the negative portion of the push-pull signal as appears at the secondary winding 68 is fed through a circuit which is identical in every respect to the circuit described for the positive going signal. The signal, however, will be exactly 180° out of phase with the signal in the circuit described. Accordingly, certain reference numerals associated with elements described above have been carried to corresponding elements in the negative portion of the circuit and have been identified with the additional designation "$\pi$" to indicate that the signals concerned are 180° out of phase with the signals of corresponding elements in the positive portion of the circuit.

In addition to providing substantial linearity without the use of a costly step-down transformer between the audio amplified signal and the non-linear grids of the modulator tubes, the transistor circuit of this invention eliminates the need for a separate bias supply which would otherwise be necessary to feed the grids of the modulator tubes. This is possible because the emitter-follower circuit provided has been designed to operate at a nominal or quiescent voltage level which is equal to the bias level required at the grids of the modulator tubes.

In addition, tube driven circuits incorporate a substantial phase shift in response to large feedback signals. For large feedback signals the phase shift of the tube driven networks may be such as to convert the negative feedback into positive feedback which is destructive of the circuit elements. However, the transistorized circuit of this invention has less phase shift inherent therein and, accordingly, a high level feedback may be possible for reducing distortion associated with the modulator tubes 155 and 157. For instance, in the tube operated networks a maximum feedback in the order of 8 to 10 db can be expected. However, in the transistorized network of this invention, feedback in the order of 18 db is accomplished. Also, distortion in the order of 4–5% can be expected from tube-driven networks, while the transistorized network of this invention yields distortion in the order of .6–.8%.

It will be understood that various modifications and combinations of the many detailed features of this invention may be accomplished by those versed in the art, but I desire to claim all such modifications and combinations as properly come within the scope and the spirit of my invention.

I claim as my invention:

1. An amplifier network comprising:

a first string of transistors series connected to have a substantial voltage gain from the input to the output thereof, means for applying an information voltage signal to the input of said first string of transistors, a second string of transistors series connected to have a substantial current gain from the input to the output thereof, means for applying the output of said first string of transistors to the input of said second string of transistors.

a high power amplifier tube having a voltage gain substantially greater than unity and having an anode, cathode and a control grid, and means for applying the output of said second string of transistors to said control grid, said anode to cathode circuit of said high power amplifier tube being connected in a separate current path from that of said second string of transistors.

2. An amplifier network in accordance with claim 1 wherein said first string of transistors conforms to a common emitter connection and said second string of transistors conforms to a common collector connection.

3. An amplifier network in accordance with claim 1 wherein base-to-base resistors are connected between the base of each transistor and the base of each adjacent series connected transistor in both said first and said second strings and wherein a change in current within a transistor of said first string produces a change in voltage across said base-to-base resistors of said second string which change in voltage is reflected across said base-to-base transistors of said first string.

4. An amplifier device in accordance with claim 3 wherein means are provided for feeding a portion of the output of said amplifier tube back to the input of said first string of transistors.

5. A solid state driver circuit comprising:

a compound amplifier stage having a first and a second string of series connected transistors, the output of each transistor of said first string being connected to the input of one transistor of said second string, a substantially low resistance connected from the base to emitter of each transistor of said second string and a substantially high base-to-base resistance connected from the base of one transistor to the base of an adjacent series connected transistor in said first string, and the total output of said second string being divided approximately equally between the inputs of each transistor in said first string.

6. A solid state driver circuit in accordance with claim 5 wherein the base of each transistor of said second string is connected to the emitter of one transistor of said first string and wherein said substantially low resistance is also connected between an emitter of one transistor and a collector of an adjacent series transistor of said first string.

7. A solid state driver circuit comprising:

a controller transistor, means for applying an information signal across the input of said controller transistor, a compound amplifier stage having a first and second string of series connected transistors, the output of each transistor of said first string being connected to the input of one associated transistor of said second string, a substantially high base-to-base resistance connected from the base of one transistor of said first string to the base of an adjacent series connected transistor, and the combined output voltage of said second string being applied across the combined base-to-base resistances of said first string.

8. A solid state driver circuit in accordance with claim 7 wherein said second string transistors are connected in a common emitter configuration.

9. A solid state driver circuit in accordance with claim 7 wherein said first string transistors are connected in a common collector configuration and wherein said second string transistors are connected in a common emitter configuration.

10. A solid state driver circuit comprising:

a first compound amplifier stage having a first and second string of series connected transistors therein, the output of each transistor of said first string being connected to the input of one associated transistor of said second string.

a substantially high base-to-base resistance connected from the base of one transistor of said first string to the base of an adjacent series connected transistor, said relatively high base-to-base resistance forming an input resistance string, a second compound amplifier stage having a third and fourth string of series connected transistors therein, the output of each transistor of said third string being connected to the input of one associated transistor of said fourth string, a relatively high base-to-base resistance connected from the base of one transistor of said third string to the base of an adjacent series connected transistor, said relatively high base-to-base resistance forming an output resistance string, means for connecting the output of said second transistor string to a first end of said output resistance string, means for connecting said input resistance string to said output resistance string, and means for applying a power source to the second end of said output resistance string.

11. A solid state driver circuit in accordance with claim 10 wherein said first compound amplifier stage is connected in a common emitter configuration and said second compound amplifier stage is connected in a common collector configuration.

12. A solid state driver circuit in accordance with claim 10 wherein a controller transistor is provided and wherein the output of said controller transistor is connected to the input of said first compound amplifier and wherein means are provided for applying an information signal across the input of said controller transistor.

13. In a push-pull amplifier including push-pull amplifier tubes having substantially non-linear grid impedances, solid state means for applying an audio signal to the respective grids of said amplifier tubes, said solid state means including:

a first compound amplifier stage having a first and second string of series connected transistors, said transistors being connected for having a substantial voltage gain from the input to the output thereof, a second compound amplifier stage having a third and fourth string of series connected transistors therein, said transistors being connected for having a substantial current gain from the input to the output thereof, means applying the output of said first compound amplifier stage to the input of said second compound amplifier stage and means applying the output of said second compound amplifier stage to the respective grids of said amplifier tubes.

14. A push-pull amplifier in accordance with claim 13 wherein said second string of transistors is connected in a common emitter configuration and wherein said fourth string of transistors is connected in a common collector configuration.

15. A push-pull amplifier in accordance with claim 14 wherein a controller transistor is provided and wherein means are included for applying an audio signal to the input of said controller transistor and wherein the output of said controller transistor is connected to the input of said first compound amplifier stage.

16. A push-pull amplifier in accordance with claim 15 wherein the output of one of said amplifier tubes is fed back to the input of said controller transistor for applying a predistorted information signal to the respective grid of said one amplifier.

17. A push-pull amplifier in accordance with claim 13 wherein the output of each transistor of said first string is connected to the input of each transistor of said second string, and wherein a substantially high base-to-base resistance is connected from the base of one transistor of said first string to the base of an adjacent series connected transistor.

18. A push-pull amplifier in accordance with claim 17 wherein the output voltage of said first compound amplifier is applied substantially equally across said base-to-base resistances thereof.

19. A push-pull amplifier in accordance with claim 18 wherein the output voltage of said first compound amplifier is applied to the inputs of both said first compound amplifier and said second compound amplifier.

20. The combination of:

an amplifier tube and a solid state amplifier stage having a string of series connected transistors for amplifying an information signal, said amplifier stage being connected in an emitter follower configuration and having an output thereof operably connected to the grid of said amplifier tube.

21. The combination of claim 20 including:

a second string of series connected transistors connected in a common emitter configuration and having the output thereof connected to the input of said transistor string connected in an emitter follower configuration.

References Cited

UNITED STATES PATENTS

| | | | |
|---|---|---|---|
| 2,888,525 | 5/1959 | Eckess et al. | 330—18 |
| 2,926,307 | 2/1960 | Ehret | 330—18 |
| 3,253,225 | 5/1966 | Dalton et al. | 330—18 X |
| 3,265,981 | 9/1966 | Dill | 330—28 X |
| 3,325,742 | 6/1967 | Moriyasu | 330—20 X |

ROY LAKE, Primary Examiner

L. J. DAHL, Assistant Examiner

U.S. Cl. X.R.

330—18, 122